(12) United States Patent
Zhang et al.

(10) Patent No.: US 10,367,052 B2
(45) Date of Patent: Jul. 30, 2019

(54) DISPLAY PANEL AND DISPLAY DEVICE

(71) Applicant: WUHAN TIANMA MICRO-ELECTRONICS CO., LTD., Wuhan (CN)

(72) Inventors: Chunpeng Zhang, Wuhan (CN); Bo Li, Wuhan (CN); Yangzhao Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/161,081

(22) Filed: Oct. 16, 2018

(65) Prior Publication Data

US 2019/0051718 A1 Feb. 14, 2019

(30) Foreign Application Priority Data

Jun. 26, 2018 (CN) .......................... 2018 1 0671484

(51) Int. Cl.
*H01L 27/32* (2006.01)
*G09G 3/3225* (2016.01)

(52) U.S. Cl.
CPC ....... *H01L 27/3276* (2013.01); *G09G 3/3225* (2013.01); *G09G 2300/043* (2013.01); *G09G 2300/0426* (2013.01); *G09G 2320/0223* (2013.01); *G09G 2320/0233* (2013.01)

(58) Field of Classification Search
CPC .............. H01L 27/3276; G09G 3/3225; G09G 2300/0426; G09G 2300/043; G09G 2320/0233; G09G 2320/0223
See application file for complete search history.

(56) References Cited

U.S. PATENT DOCUMENTS 9,093,537 B2 * 7/2015 Lee .................... H01L 29/66765
9,412,800 B2 * 8/2016 Kim .................... H01L 27/3262

\* cited by examiner

*Primary Examiner* — David Vu
(74) *Attorney, Agent, or Firm* — Kilpatrick Townsend & Stockton LLP

(57) ABSTRACT

A display panel and a display device are provided. A display region is divided into a first display region and at least one second display region smaller than the first display region. The display panel includes compensation lines and to-be-compensated lines located in the display region. Each compensation line is electronically connected with one to-be-compensated line, an orthographic projection of the compensation line on the substrate is overlapped with an orthographic projection of one power supply line on the substrate, and a capacitance is formed between the compensation line and the power supply line, or each compensation line is electronically connected with one power supply line, an orthographic projection of the compensation line on the substrate is overlapped with an orthographic projection of one to-be-compensated line on the substrate, and a capacitance is formed between the compensation line and the to-be-compensated line.

17 Claims, 12 Drawing Sheets

DISPLAY PANEL AND DISPLAY DEVICE

CROSS REFERENCE OF RELATED APPLICATION

The present application claims priority to Chinese Patent Application No. 201810671484.0, titled "DISPLAY PANEL AND DISPLAY DEVICE", filed on Jun. 26, 2018 with the Chinese Patent Office, which is incorporated herein by reference in its entirety.

FIELD

The present disclosure relates to the field of display, and particularly to a display panel and a display device.

BACKGROUND

With the development of technology, a display device having a display panel is applied more and more widely, and more and more requirements for the display panel, including the appearance of the display panel are proposed, in addition to conventional performances such as a large size and a high definition of the display panel. Therefore, non-rectangular display panels are developed.

Due to the non-rectangular display panels, the display panels no longer have only a conventional rectangular structure, which not only leads to the diverse display effect, but also leads to the display panels being more and more widely. The display panels are already applied to wearable electronic devices such as a watch, glasses, or a smart bracelet. Multiple sub-pixel units are generally arranged on the display panel. In a case that the display panel is of a non-rectangular shape, for example, including an arc-shaped edge, the number of sub-pixel units at the arc-shaped edge is different from the number of sub-pixel units at a non-arc-shaped edge, and a load in a region of the arc-shaped edge is different from a load in a region of the non-arc-shaped edge, resulting in non-uniform brightness of the display panel.

SUMMARY

In view of this, a display panel and a display device are provided in the present disclosure, in which a compensation line is introduced to perform resistance and capacitance compensation on a region corresponding to a second gate line and/or a second data line. Further, the compensation line is located in a display region and does not occupy a non-display region, saving the space of the non-display region, and facilitating the realization of a narrow frame of the display panel and the display device.

In one embodiment, a display panel is provided in the present disclosure. The display panel includes: a substrate, a display region, and a non-display region surrounding the display region. The display region is divided into a first display region and at least one second display region smaller than the first display region.

The display region further includes: a first metal layer, a first insulating layer, a second metal layer, a second insulating layer, and a third metal layer which are sequentially arranged in a direction away from the substrate.

The display panel further includes: multiple gate lines extending in a first direction and arranged in a second direction, multiple data lines arranged in the first direction and extending in the second direction, and multiple power supply lines arranged in the first direction and extending in the second direction, which are arranged above the substrate. The first direction intersects the second direction. The multiple gate lines are located on the first metal layer. The multiple data lines and the multiple power supply lines are located on the second metal layer. The multiple gate lines include first gate lines and second gate lines shorter than the first gate lines. The multiple data lines include first data lines and second data lines shorter than the first data lines. The first gate lines are located in the first display region, and the second gate lines are located in the second display region.

The display panel further includes multiple compensation lines and to-be-compensated lines located in the display region. The multiple compensation lines are located on the third metal layer. Each of the multiple compensation lines is electronically connected with one of the to-be-compensated lines, an orthographic projection of the compensation line on the substrate is overlapped with an orthographic projection of one of the multiple power supply lines on the substrate, and a capacitance is formed between the compensation line and the power supply line; or each of the multiple compensation lines is electronically connected with one of the multiple power supply lines, an orthographic projection of the compensation line on the substrate is overlapped with an orthographic projection of one of the to-be-compensated lines on the substrate, and a capacitance is formed between the compensation line and the to-be-compensated line.

In another embodiment, a display device is provided in the present disclosure, which includes the display panel described above.

BRIEF DESCRIPTION OF THE DRAWINGS

The drawings illustrated herein are used to provide a further understanding of the present disclosure, and form a part of the present disclosure. Exemplary embodiments in the present disclosure and the description thereof are intended to set forth the present disclosure, and are not intended to limit the present disclosure.

DETAILED DESCRIPTION OF THE EMBODIMENTS

Figure 1:
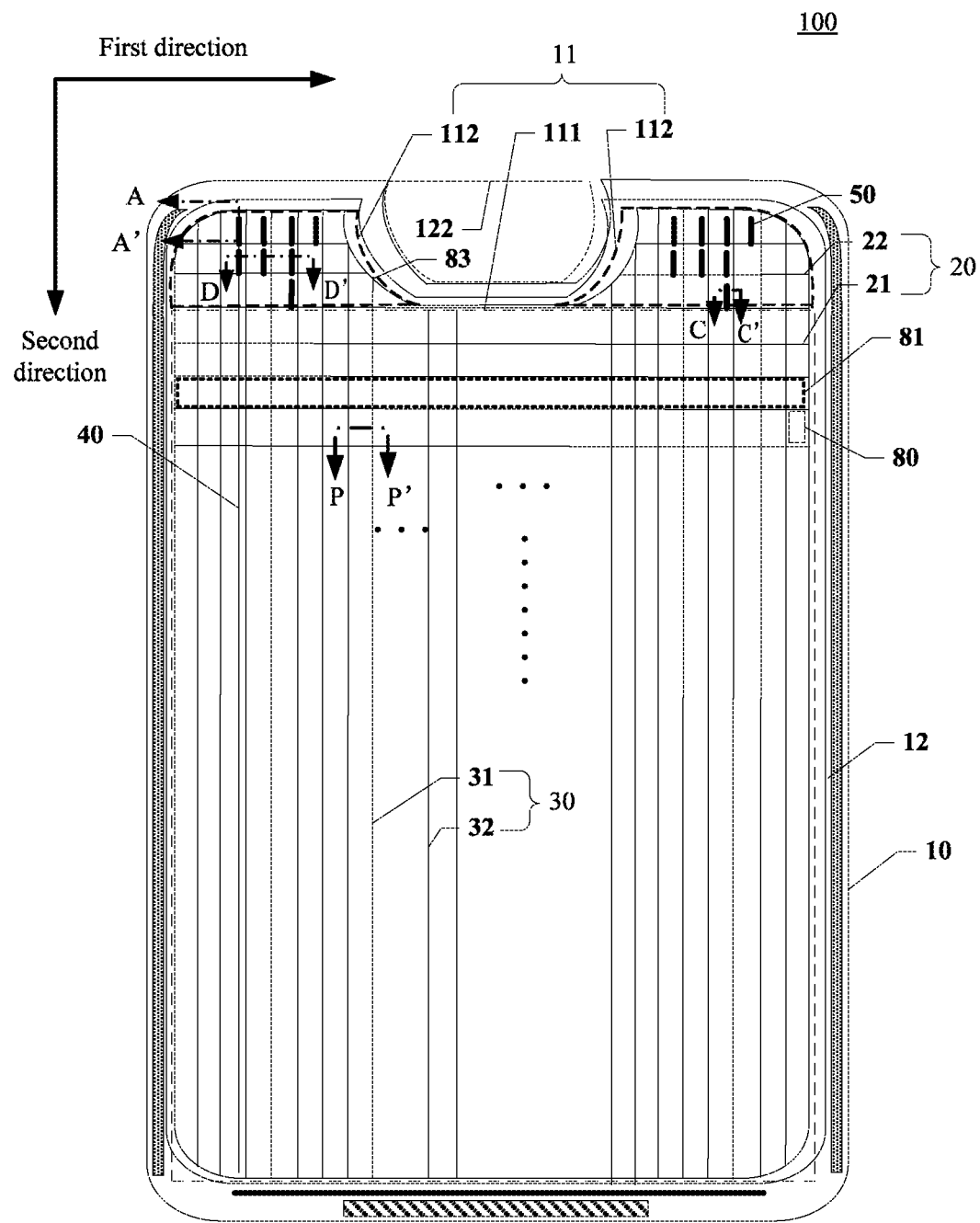
FIG. 1 is a top view of a display panel according to an embodiment of the present disclosure.

Some words are used to represent specific components in the specification and claims, and it should be understood that different names may be used by hardware manufacturers to call a same component. In the specification and claims, different components are distinguished by differences between functions, rather than by using different names. For example, a term such as "including" used in the specification and claims is an open term, which should be construed as "including but not limited to". Further, a term "approximately" refers to being in an acceptable error range. In addition, a term "coupling" may be construed as including any direct and indirect electrical coupling manners. Therefore, if a statement "a first device is coupled to a second device" exists in the specification, it is indicated that the first device may be electrically coupled to the second device directly or indirectly by other devices or in other coupling manners. The following description in the specification shows embodiments of the present disclosure, but the description is only used for illustrating the general principle of the present disclosure and is not intended to limit the scope of the present disclosure. The protection scope of the present disclosure should be defined by the appended claims.

Due to the non-rectangular display panels, the display panels no longer have only a rectangular structure, which not only leads to the diverse display effect, but also leads to the display panels being applied more and more widely. The display panels are already applied to wearable electronic devices such as a watch, glasses, or a smart bracelet. Multiple sub-pixel units are generally arranged on the display panel. In a case that the display panel is of a non-rectangular shape, for example, including an arc-shaped edge, the number of sub-pixel units at the arc-shaped edge is different from the number of sub-pixel units at a non-arc-shaped edge, and a load in a region of the arc-shaped edge is different from a load in a region of the non-arc-shaped edge, resulting in non-uniform brightness of the display panel.

In view of this, a display panel and a display device are provided in the present disclosure, in which a compensation line is introduced to perform resistance and capacitance compensation on a region corresponding to a second gate line and/or a second data line. Further, the compensation line is located in a display region and does not occupy a non-display region, saving the space of the non-display region, and facilitating the realization of a narrow frame of the display panel and the display device.

The display panel provided in the present disclosure includes: a substrate, a display region, and a non-display region surrounding the display region. The display region is divided into a first display region and at least one second display region smaller than the first display region.

The display region further includes: a first metal layer, a first insulating layer, a second metal layer, a second insulating layer, and a third metal layer which are sequentially arranged in a direction away from the substrate.

The display panel further includes: multiple gate lines extending in a first direction and arranged in a second direction, multiple data lines arranged in the first direction and extending in the second direction, and multiple power supply lines arranged in the first direction and extending in the second direction, which are arranged above the substrate. The first direction intersects the second direction. The multiple gate lines are located on the first metal layer. The multiple data lines and the multiple power supply lines are located on the second metal layer. The multiple gate lines include first gate lines and second gate lines shorter than the first gate lines. The multiple data lines include first data lines and second data lines shorter than the first data lines. The first gate lines are located in the first display region, and the second gate lines are located in the second display region.

The display panel further includes multiple compensation lines and to-be-compensated lines located in the display region. Each of the to-be-compensated lines is one of the second gate lines or one of the second data lines. The multiple compensation lines are located on the third metal layer. Each of the multiple compensation lines is electronically connected with one of the to-be-compensated lines, an orthographic projection of the compensation line on the substrate is overlapped with an orthographic projection of one of the multiple power supply lines on the substrate, and a capacitance is formed between the compensation line and the power supply line; or each of the multiple compensation lines is electronically connected with one of the multiple power supply lines, an orthographic projection of the compensation line on the substrate is overlapped with an orthographic projection of one of the to-be-compensated line on the substrate, and a capacitance is formed between the compensation line and the to-be-compensated line.

The solutions in present disclosure are described in detail below in conjunction with the drawings and embodiments.

Firstly, the solutions in present disclosure are described in a case that the to-be-compensated line is a second gate line.

Figure 2:
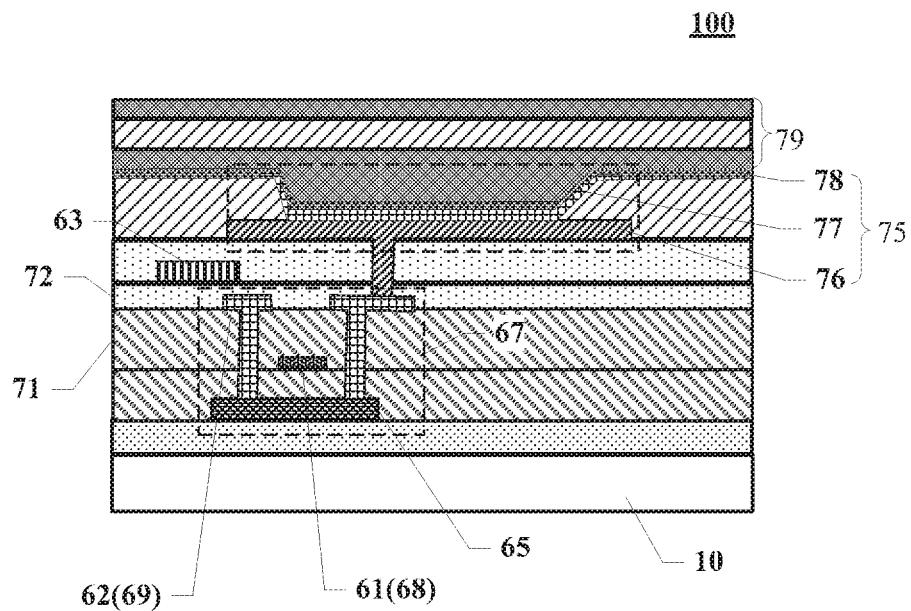
FIG. 2 is a sectional view of the display panel taken along a line PP' in FIG. 1.
Figure 3:
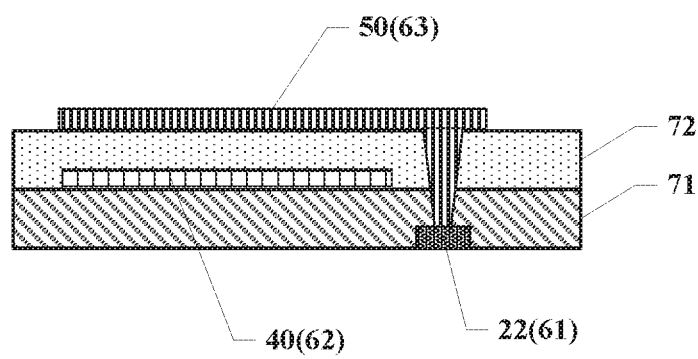
FIG. 3 is a sectional view of the display panel taken along a line AA' in FIG. 1.
Figure 4:
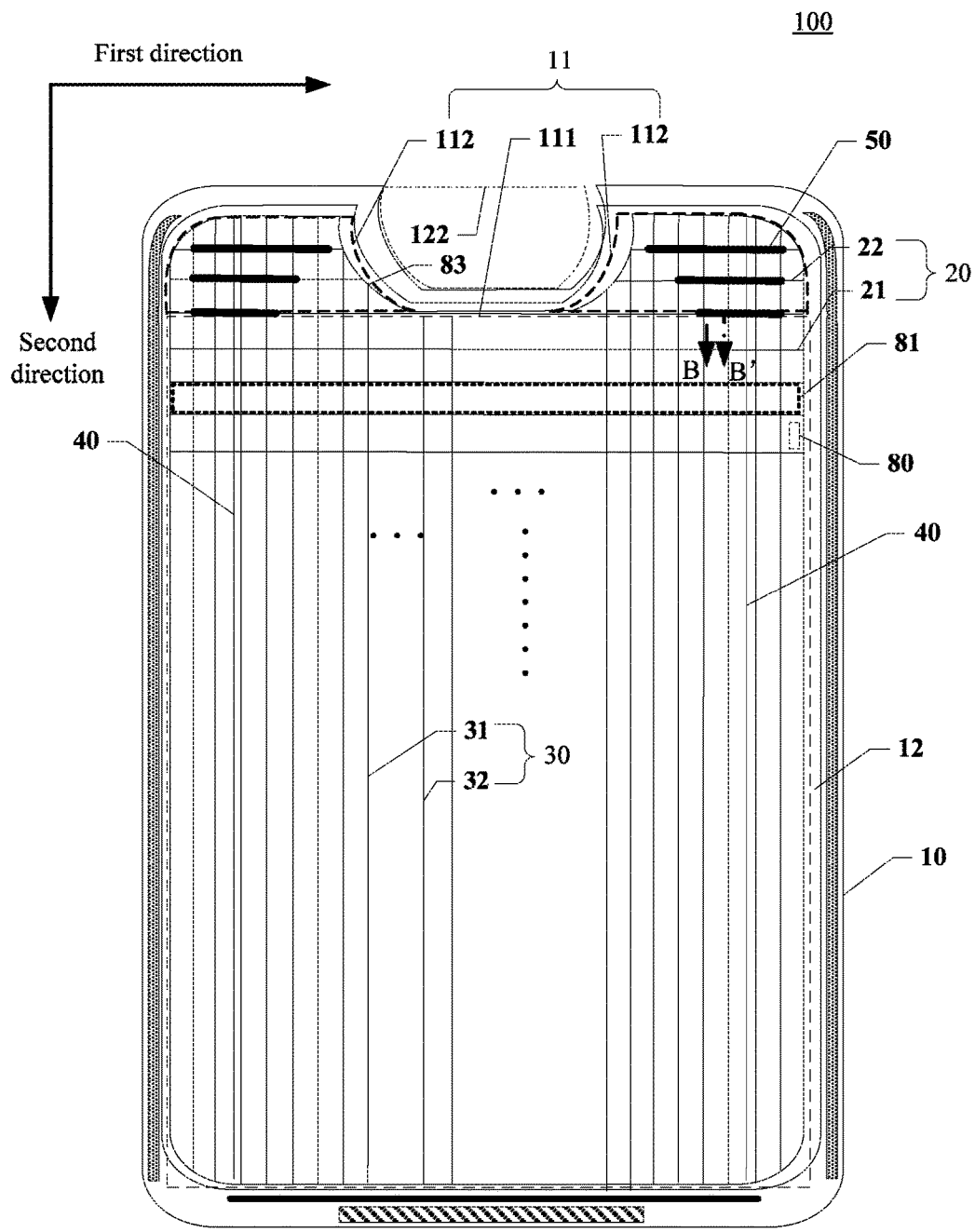
FIG. 4 is a top view of a display panel according to another embodiment of the present disclosure.
Figure 5:
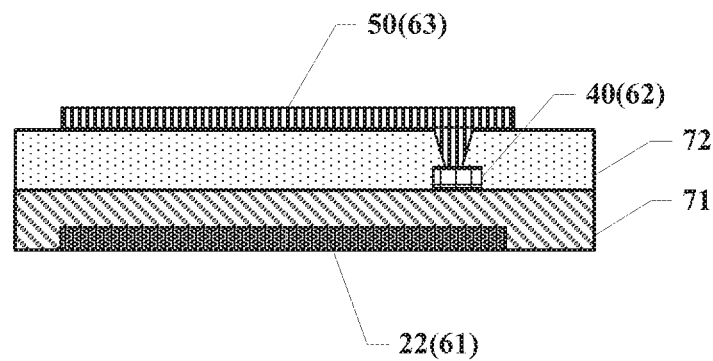
FIG. 5 is a sectional view of the display panel taken along a line BB' in FIG. 4.

FIG. 1 is a top view of a display panel according to an embodiment of the present disclosure, FIG. 2 is a sectional view of the display panel taken along a line PP' in FIG. 1, FIG. 3 is a sectional view of the display panel taken along a line AA' in FIG. 1, FIG. 4 is a top view of a display panel according to another embodiment of the present disclosure, and FIG. 5 is a sectional view of the display panel taken along a line BB' in FIG. 4. It should be noted that FIGS. 2, 3 and 5 only illustrate relationships between film layers, rather than all detailed film layer structures. With reference to FIGS. 1 to 5, a display panel 100 is provided according to an embodiment of the present disclosure. The display panel 100 includes a display region 11 and a non-display region 12 surrounding the display region 11. The display region 11 is divided into a first display region 111 and at least one second display region 112 smaller than the first display region 111.

With reference to FIG. 2, the display panel 100 further includes: a substrate 10, and a first metal layer 61, a first insulating layer 71, a second metal layer 62, a second insulating layer 72, and a third metal layer 63 which are sequentially arranged in a direction away from the substrate 10.

With reference to FIG. 1 and FIG. 2, the display panel 100 further includes: multiple gate lines 20 extending in a first direction and arranged in a second direction, multiple data lines 30 arranged in the first direction and extending in the second direction, and multiple power supply lines 40 arranged in the first direction and extending in the second direction, which are arranged above the substrate 10. The first direction intersects the second direction. The multiple gate lines 20 are located on the first metal layer 61. The multiple data lines 30 and the multiple power supply lines 40 are located on the second metal layer 62. The multiple gate lines 20 include first gate lines 21 and second gate lines 22 shorter than the first gate lines 21, The multiple data lines 30 includes first data lines 31 and second data lines 32 shorter than the first data lines 31. The first gate lines 21 are located in the first display region 111, the second gate lines 22 are located in the second display region 112.

With reference to FIG. 1, FIG. 3 and FIG. 5, the display panel 100 further includes multiple compensation lines 50 and to-be-compensated lines in the display region 11. The to-be-compensated lines may be the second gate lines 22, and the compensation lines 50 are located on the third metal layer 63. In an embodiment, as shown in FIG. 3, each of the multiple compensation lines 50 is electronically connected with one of the second gate lines 22, an orthographic projection of the compensation line 50 on the substrate 10 is overlapped with an orthographic projection of one of the power supply lines 40 on the substrate 10, and a capacitance is formed between the compensation line 50 and the power supply line 40. In another embodiment, as shown in FIG. 5, each of the compensation lines 50 is electronically connected with one of the power supply lines 40, an orthographic projection of the compensation line 50 on the substrate 10 is overlapped with an orthographic projection of one of the second gate lines 22 on the substrate 10, and a capacitance is formed between the compensation line 50 and the second gate line 22.

FIG. 1 shows a case that the display panel 100 includes two second display regions 112. The two display regions 112 are located at a top end of the display panel 100, the non-display region 12 between the two display regions 112 are usually referred to as a Notch region 122. FIG. 3 and FIG. 5 illustrates two implementations of compensating the second gate line 22 shorter than the first gate line. In the embodiment illustrated in FIG. 3, the compensation line 50 has the same potential as the second gate line 22, which is equivalent to extending the second gate line 22, increasing a resistance of the second gate line 22. Further, a voltage is formed between the compensation line 50 and the power supply line 40, which is equivalent to increasing a capacitance of the second gate line 22. In the embodiment illustrated in FIG. 5, the compensation line 50 is added in the second display region 112, which is equivalent to increasing a resistance of the second display region 112. Further, a capacitance is formed between the compensation line 50 and the second gate line 22, which is equivalent to increasing a capacitance of the second display region 112. In the two compensation implementations shown in FIG. 3 and FIG. 5, the resistance and the capacitance of the second display region 112 may be compensated, and thus a load of the second display region 112 may be compensated. Therefore, with the compensation line 50, a load difference between the second display region 112 and the first display region 111 due to length differences between the gate lines 20 can be reduced, and thus a brightness difference between the second display region 112 and the first display region 111 can be reduced, so as to uniform the display brightness of the first display region 111 and the second display region 112 and enhance the user visual experience.

It can be seen from FIG. 1 and FIG. 4 that the compensation line 50 provided in the embodiment of the present disclosure is located in the display region 11, so that the compensation line 50 does not occupy the non-display region 12 while achieving the load compensation. In this way, a narrow frame of the display panel 100 can be easily realized, and the narrow frame of the display panel 100 does not affect the load compensation. Further, in actual applications, the user may accurately calculate a preset compensation value, i.e., a compensation load, according to actual situations, and the user may determine the size of the compensation line 50 or the capacitance formed between the compensation line 50 and the power supply line 40 or the gate line 20 based on the preset compensation value. If the compensation line 50 is arranged in the non-display region 12, since the non-display region 12 has a limited space, the size of the compensation line 50 that can be accommodated in the non-display region is limited. In this case, an actual compensation load is often difficult to reach the preset compensation value, which results in a brightness difference between the second display region 112 and the first display region 111. However, if the compensation line 50 is arranged in the display region 11, since the display region 11 has a large space, the display region 11 has enough space to arrange a certain number of compensation lines 50 having certain sizes. In this case, the actual compensation load can meet actual requirements and can reach the preset compensation value. Therefore, with the solution of arranging the compensation line 50 in the display region 11, the brightness difference between the second display region 112 and the first display region 111 can be reduced, so as to uniform the display brightness of the entire display region 11 of the display panel 100.

In an embodiment, with reference to FIG. 1, in a case that a capacitance is formed between the compensation line 50 and the power supply line 40, an extension direction of the compensation line 50 is the same as an extension direction of the power supply line 40. In one embodiment, with reference to FIG. 1 and FIG. 3, if a capacitance is required to be formed between the compensation line 50 and the power supply line 40, an orthographic projection of the compensation line 50 on the substrate is required to be overlapped with an orthographic projection of the power supply line 40 on the substrate. In a case that the extension direction of the compensation line 50 is the same as the extension direction of the power supply line 40, an overlapping area between the orthographic projections of the compensation line 50 and the power supply line 40 on the substrate is maximum if the size of the compensation line 50 remains unchanged, as compared with other cases that the extension direction of the compensation line 50 is not the same as the extension direction of the power supply line 40. Therefore, with this embodiment, the size of the compensation line 50 can be reduced, the production cost can be saved, and the load compensation can be achieved.

Figure 6:
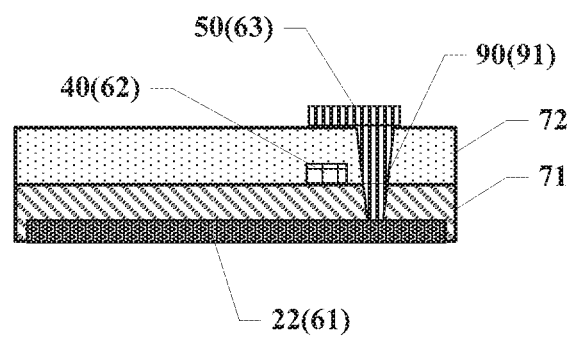
FIG. 6 is a sectional view of the display panel taken along a line CC' in FIG. 1.
Figure 7:
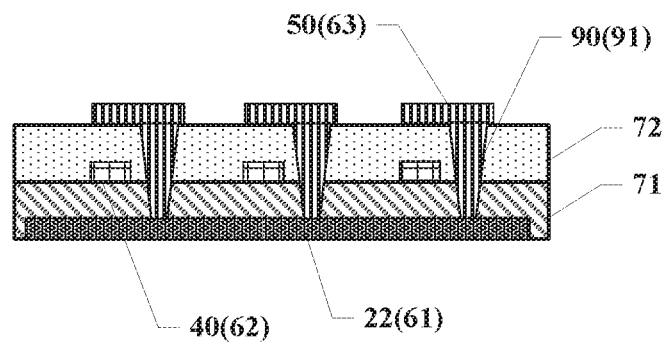
FIG. 7 is a sectional view of the display panel taken along a line DD' in FIG. 1.

In an embodiment, each to-be-compensated line (i.e., the second gate line 22 in the embodiment of the present disclosure) is electronically connected with one or more compensation lines 50. FIG. 6 is a sectional view of the display panel taken along a line CC' in FIG. 1, and FIG. 7 is a sectional view of the display panel taken along a line DD' in FIG. 1. It should be noted that FIG. 6 and FIG. 7 only illustrate a relative position between the second gate line 22 and the compensation line 50, rather than actual film layer structures. In the embodiment illustrated in FIG. 6, only one compensation line 50 is electronically connected with one second gate line 22. In the embodiment illustrated in FIG. 7, three compensation lines 50 are electronically connected with one second gate line 22. With reference to FIG. 1, FIG. 6 and FIG. 7, since a length of the second gate line 22 corresponding to FIG. 6 is greater than a length of the second gate line 22 corresponding to FIG. 7, a compensation load for a region corresponding to the second gate line 22 in FIG. 6 is less than a compensation load for a region corresponding to the second gate line 22 in FIG. 7. In this case, the compensation load may increase by increasing the number of compensation lines 50 electronically connected with the second gate line 22 in FIG. 7, to reduce the load difference and the brightness difference between regions corresponding to different second gate lines 22.

In an embodiment, at least one of compensation lines 50 is electronically connected with the to-be-compensated line through a first via hole 90. In the embodiments illustrated in FIG. 6 and FIG. 7, at least one of compensation lines 50 is electronically connected with the second gate line 22 through the first via hole 90, which can be easily implemented.

In an embodiment, the first via hole 90 may be a first A via hole 91 located on the first insulating layer 71 and the second insulating layer 72. Since the compensation line 50 is located on the third metal layer 63 and the second gate line 22 is located on the first metal layer 61, the compensation line 50 and the second gate line 22 are separated from each other by the first insulating layer 71 and the second insulating layer 72. In this case, the first A via hole 91 is required to penetrate the first insulating layer 71 and the second insulating layer 72, so as to realize the electrical connection.

Figure 8:
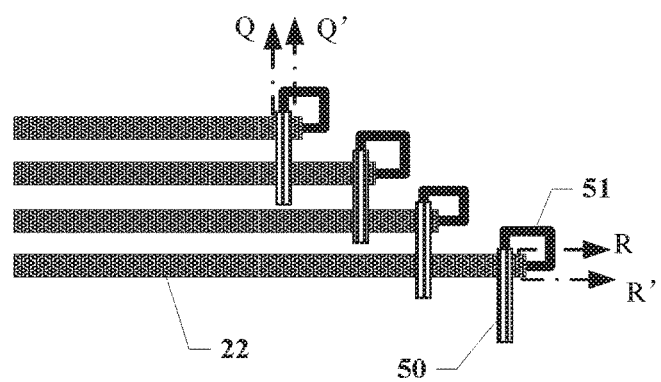
FIG. 8 is a schematic view showing a relative position between a second gate line and a first connection lead according to an embodiment of the present disclosure.

In an embodiment, reference is made to FIG. 8, which is a schematic view showing a relative position between a second gate line and a first connection lead according to an embodiment of the present disclosure. As shown in FIG. 8, at least one of compensation lines 50 is electronically connected with the to-be-compensated line (i.e., the second gate line 22 in the embodiment of the present disclosure) through a first connection lead 51. The first connection lead 51 is located in the non-display region 12.

In the embodiment illustrated in FIG. 8, the compensation line 50 is electronically connected with the second gate line 22 through the first connection lead 51. The first connection lead 51 encircles the position of the compensation line 50 from the non-display region 12 at a side of the second gate line 22, which is applicable to a case that the compensation line 50 is located at a position close to the Notch region 122 of each pixel unit row 81 in the second display region 112. In this case, a winding width of the first connecting lead 51 is small, so that the first connecting lead occupies a small space in the non-display region 12, which does not affect the narrow frame of the display panel 100. Further, since the second gate line 22 and the compensation line 50 are connected with each other through the first connection lead 51, the wiring on the display panel 100 is clear, and the logic thereof is clear.

Figure 9:
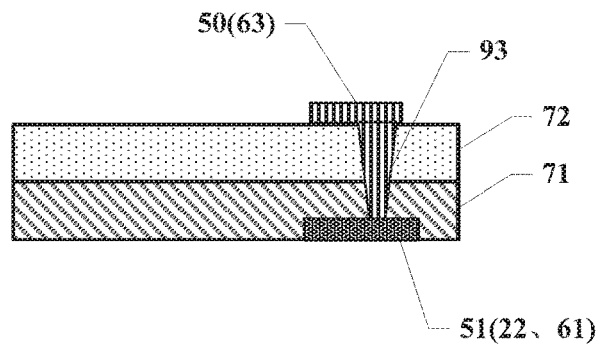
FIG. 9 is a schematic view of a film layer structure showing an electrical connection between a first connection lead and a compensation line.
Figure 10:
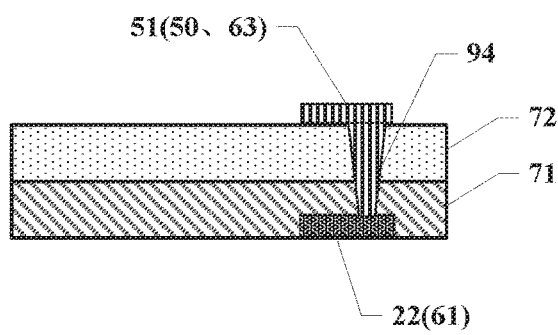
FIG. 10 is a schematic view of a film layer structure showing an electronic connection between a first connection lead and a second gate line.

In an embodiment, reference is made to FIG. 9, which is a schematic view of a film layer structure showing an electrical connection between a first connection lead and a compensation line. FIG. 9 illustrates a sectional view of the structure taken along a line QQ' in FIG. 8 in a case that the first connection lead 51 is arranged on the same layer as the second gate line 22, which only shows a connection between the first connection lead 51 and the compensation line 50. As illustrated in FIG. 9, in the case that the to-be-compensated line is the second gate line 22, the first connection lead 51 is arranged on the same layer as the second gate line 22, and the first connection lead 51 is electronically connected with the compensation line 50 through a second A via hole 93 located on the first insulating layer 71 and the second insulating layer 72. In another embodiment, reference is made to FIG. 10, which is a schematic view of a film layer structure showing an electrical connection between a first connection lead and a second gate line. FIG. 10 illustrates a sectional view of the structure taken along a line RR' in FIG. 8 in a case that the first connection lead 51 is arranged on the same layer as the compensation line 50. The first connection lead 51 is arranged on the same layer as the compensation line 50, and the first connection lead 51 is electronically connected with the second gate line 22 through a second B via hole 94 located on the first insulating layer 71 and the second insulating layer 72.

In an embodiment, with reference to FIG. 4, in a case that a capacitance is formed between the compensation line 50 and the to-be-compensated line (i.e., the second gate line 22 in the embodiment of the present disclosure), an extension direction of the compensation line 50 is the same as an extension direction of the to-be-compensated line (i.e., the second gate line 22 in the embodiment of the present disclosure). In one embodiment, with reference to FIG. 4 and FIG. 5, if a capacitance is required to be formed between the compensation line 50 and the second gate line 22, an orthographic projection of the compensation line 50 on the substrate is required to be overlapped with an orthographic projection of the second gate line 22 on the substrate. In a case that the extension direction of the compensation line 50 is the same as the extension direction of the second gate line 22, an overlapping area between the orthographic projections of the compensation line 50 and the second gate line 22 on the substrate is maximum if the size of the compensation line 50 remains unchanged, as compared with other cases that the extension direction of the compensation line 50 is not the same as the extension direction of the second gate line 22. Therefore, with this embodiment, the size of the compensation line 50 can be reduced, the production cost can be saved, and the load compensation can be achieved.

In an embodiment, with reference to FIG. 6, in the display region 11 (i.e., the second display region 112 in the embodiment of the present disclosure), an orthographic projection of each to-be-compensated line (i.e., the second gate line 22 in the embodiment of the present disclosure) on the substrate 10 is overlapped with an orthographic projection of one compensation line 50 on the substrate. The size of the compensation line 50 and the overlapping area between the orthographic projections of the compensation line 50 and the second gate line 22 on the substrate may be determined based on the preset compensation value, so as to realize the load compensation.

In an embodiment, with reference to FIG. 7, in the display region 11 (i.e., the second display region 112 in the embodiment of the present disclosure), an orthographic projection of each to-be-compensated line (i.e., the second gate line 22 in the embodiment of the present disclosure) on the substrate 10 is overlapped with orthographic projections of multiple segmented compensation lines 50 on the substrate. In a case that the second gate line 22 is short, which requires a large compensation load, multiple segmented compensation lines 50 may be provided for the second gate line 22. Each of the multiple segmented compensation lines 50 may be electronically connected with the power supply line 40 to form a capacitance between the segmented compensation line 50 and the second gate line 20, so as to achieve better load compensation.

In an embodiment, it can be seen from FIG. 1 and FIG. 4 that the display region 11 is provided with multiple pixel unit rows 81 arranged in the second direction. Each of the multiple pixel unit rows 81 includes multiple sub-pixel units 80 each defined by adjacent data lines 30 and adjacent gate lines 20. In the second display region 112, the number of sub-pixel units 80 in a pixel unit row 81 close to the first display region 111 is greater than the number of sub-pixel units 80 in a pixel unit row 81 away from the first display region 111.

In an embodiment, in a case that the to-be-compensated line is the second gate line 22, an overlapping area between orthographic projections of the compensation line 50 and the power supply line 40 corresponding to the pixel unit row 81 close to the first display region 111 on the substrate is less than an overlapping area between orthographic projections of the compensation line 50 and the power supply line 40 corresponding to the pixel unit row 81 away from the first display region 111 on the substrate, or an overlapping area between orthographic projections of the compensation line 50 and the second gate line 22 corresponding to the pixel unit row 81 close to the first display region 111 on the substrate is less than an overlapping area between orthographic projections of the compensation line 50 and the second gate line 22 corresponding to the pixel unit row 81 away from the first display region 111 on the substrate.

In an embodiment, with reference to FIG. 1 and FIG. 4, in order to enhance the appearance of the display panel 100, the second display region 112 generally includes at least one arc-shaped edge 83. The arc-shaped edge 83 refers to an arc intersected with both the first direction and the second direction, which is neither parallel to the first direction nor parallel to the second direction. Due to the arc-shaped edge 83, the number of sub-pixel units 80 in the pixel cell row 81 in the second display region 112 is graded. That is, as the pixel cell row 81 is close to the first display region 111, the number of sub-pixel units 80 in the pixel cell rows 81 increases. In other words, as compared with the pixel cell row 81 in the first display region 111, as the number of missing sub-pixel units 80 in the pixel cell row 81 away from the first display region 111, in the second display region 112 increases, the missing load increases, and thus the required compensation load increases. Since the load is associated with the resistance and the voltage, the resistance may be compensated by using the compensation line 50. In a case that the compensation resistances for the pixel unit rows 81 in the second display region 112 are fixed, the compensation capacitance for the second display region 112 is required to gradually become small from a side away from the first display region 111 to a side close to the first display region 111. A capacitance C may be expressed as $C=\varepsilon S/d$, where $\varepsilon$ is a constant, d indicates a distance between a compensation line 50 and a power supply line 40 or a distance between a compensation line 50 and a second gate line 22, which is also a constant, and S indicates an overlapping area between orthographic projections of the compensation line 50 and the power supply line 40 on the substrate or an overlapping area between orthographic projections of the compensation line 50 and the second gate line 22 on the substrate. Thus, the capacitance depends on the overlapping area between orthographic projections of the compensation line 50 and the power supply line 40 or between orthographic projections of the compensation line 50 and the second gate line 22 on the substrate. In the second display region 112, as the pixel unit row 81 is away from the first display region 111, the overlapping area between orthographic projections of the compensation line 50 and the power supply line 40 or between orthographic projections of the compensation line 50 and the second grid line 22 on the substrate increases, and the compensation capacitance increases. Further, as the pixel unit row 81 is close to the first display region 111, the overlapping area between orthographic projections of the compensation line 50 and the power supply line 40 or between orthographic projections of the compensation line 50 and the second grid line 22 on the substrate decreases, and the compensation capacitance decreases. With this design, the loads of the pixel unit rows 81 in the second display region 112 can be identical with each other, so as to uniform the display brightness of the second display region 112 and enhance the user visual experience. It should be noted that the compensation capacitance and the compensation resistance for each pixel unit row 81 in the second display region 112 may be calculated according to the actual situations, and the overlapping area between orthographic projections of the compensation line 50 and the power supply line or between orthographic projections of the compensation line 50 and the second gate line 22 corresponding to the pixel unit row 81 on the substrate may be flexible adjusted based on the calculated compensation values. The compensation values vary with different products, which are not limited in the present disclosure.

Figure 11:
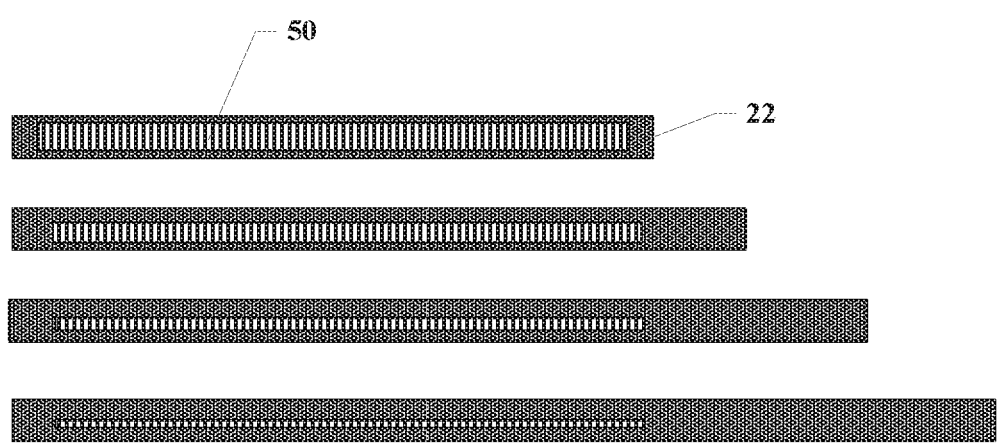
FIG. 11 is a schematic view showing a relative position between a compensation line and a second gate line in a second display region.

In an embodiment, reference is made to FIG. 11, which is a schematic view showing a relative position between a compensation line and a second gate line in a second display region. As shown in FIG. 11, a width of the compensation line 50 corresponding to the pixel unit row 81 close to the first display region 111 is less than a width of the compensation line 50 corresponding to the pixel unit row 81 away from the first display region 111. In the second display region 112, as the pixel unit row 81 is away from the first display region 111, the compensation load increases, which depends on the overlapping area between orthographic projections of the compensation line 50 and the power supply line 40 or between orthographic projections of the compensation line 50 and the second gate line 22 on the substrate. Since widths of the power supply line 40 and the second gate line 22 are fixed, the overlapping area depends on the width of the compensation line 50. Take the embodiment illustrated in FIG. 11 as an example, in a case that the required compensation load is large (for example, for the second gate line 22 at the uppermost end of the second display region 112, which has a shortest length), the compensation line 50 of which the orthographic projection on the substrate is overlapped with the orthographic projection of the second gate line 22 on the substrate may be wide. Further, in a case that the required compensation load is small (for example, for the second gate line 22 at the lowermost end of the second display region 112, which has a longest length), the compensation line 50 of which the orthographic projection on the substrate is overlapped with the orthographic projection of the second gate line 22 on the substrate may be narrow. In this way, loads of the pixel unit rows 81 in the second display region 112 can be balanced, and the load difference between the pixel unit rows 81 can be reduced, so as to uniform the display brightness of the display panel 100.

In an embodiment, with reference to FIG. 2, the display panel 100 according to the embodiment of the present disclosure further includes a thin film transistor array layer 67 arranged above the substrate 10 in a direction away from the substrate 10. The thin film transistor array layer 67 includes a gate metal layer 68 and a source drain metal layer 69. The gate metal layer 68 is located on the first metal layer 61, and the source drain metal layer 69 is located on the second metal layer 62. It should be noted that FIG. 2 only illustrates that one sub-pixel unit includes one thin film transistor, but practically one sub-pixel unit may include multiple thin film transistors, which is not limited in the present disclosure. In FIG. 2, the description is made by using the thin film transistor array layer 67 with a top gate structure, in which the gate metal layer 68 is located at a side of an active semiconductor layer away the substrate 10. The gate metal layer 68 may further be located at a side of the active semiconductor layer close to the substrate 10, i.e., having a bottom gate structure, which is not limited in the present disclosure. In addition, it can be seen from FIG. 2 that the display panel 100 according to the embodiment of the present disclosure further includes a light-emitting layer 75 and an encapsulation layer 79 arranged at a side of the third metal layer 63 away from the substrate 10. The light-emitting layer 75 includes an anode layer 76, an organic light-emitting material layer 77, and a cathode layer 78. With the encapsulation layer 79, external moistures and oxygens can be effectively prevented from entering the inside of the display panel 100 and damaging the light-emitting layer 75.

Secondly, the solutions in present disclosure are described in a case that the to-be-compensated line is a second data line 32.

It should be noted that the same contents of the embodiment that the to-be-compensated line is the second data line 32 as the above embodiment are not repeated herein.

Figure 12:
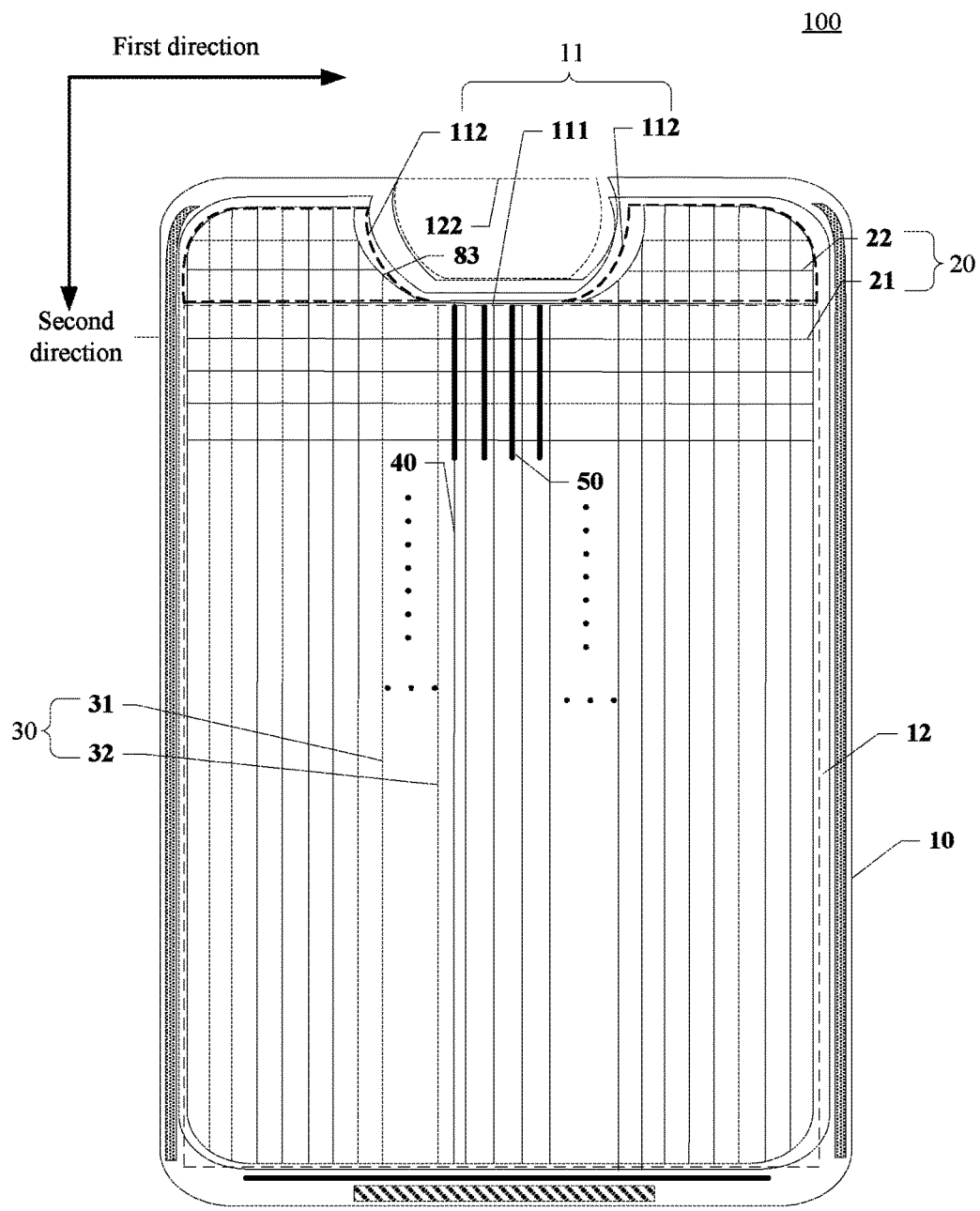
FIG. 12 is a top view of a display panel according to another embodiment of the present disclosure.
Figure 13:
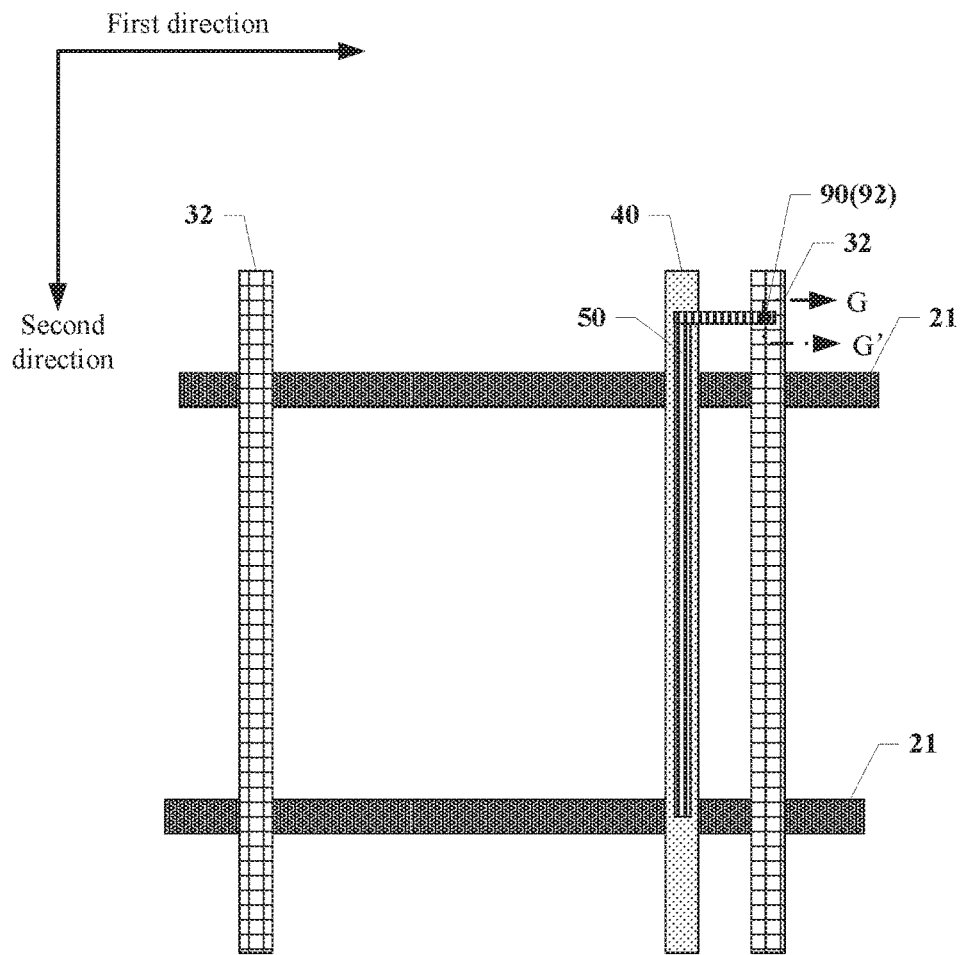
FIG. 13 is a schematic view showing wiring of sub-pixel units corresponding to a second data line in FIG. 12.

FIG. 12 is a top view of a display panel according to another embodiment of the present disclosure, and FIG. 13 is a schematic view showing wiring of sub-pixel units corresponding to a second data line in FIG. 12. It can be seen from FIG. 12 that the second data line 32 located under the Notch region is shorter than the data line in other regions, and there are sub-pixel units 80 missing in a pixel unit column corresponding to the second data line 32. In view of this, a compensation line 50 may be introduced in the embodiment of the present disclosure, to perform load compensation on the missing sub-pixel units 80. With reference to FIG. 12 and FIG. 13, the compensation line is located in the first display region 11 and is electronically connected with the second data line 32. An orthographic projection of the compensation line 50 on the substrate 10 is overlapped with an orthographic projection of the power supply line 40 on the substrate. A capacitance is formed between the compensation line 50 and the power supply line 40. An extension direction of the compensation line is the same as an extension direction of the power supply line 40.

In this embodiment, with the compensation line 50, a resistance of the second data line 32 increases. Further, a voltage is formed between the compensation line 50 and the power supply line 40, which is equivalent to increasing a capacitance of the second data line 32. In this way, a load missing in the pixel unit column corresponding to the second data line 32 can be compensated, a load difference due to different lengths of the second data lines 32 can be reduced, and thus a brightness difference between a region of a shorter second data line 32 and other regions can be reduced, so as to uniform the brightness of the display panel 100. In addition, with reference to FIG. 12, the compensation line 50 is located in the display region 11, so that the compensation line 50 does not occupy the non-display region 12 while achieving the load compensation. In this way, a narrow frame of the display panel 100 can be easily realized, and the narrow frame of the display panel 100 does not affect the load compensation. Further, in actual applications, the user may accurately calculate a preset compensation value, i.e., a compensation load, according to actual situations, and the user may determine the size of the compensation line 50 or the capacitance formed between the compensation line 50 and the power supply line 40 based on the preset compensation value. If the compensation line 50 is arranged in the non-display region 12, since the non-display region 12 has a limited space, the size of the compensation line 50 that can be accommodated in the non-display region is limited. In this case, an actual compensation load is often difficult to reach the preset compensation value, which results in a brightness difference between regions of the second data line 32 and the first data line 31. However, if the compensation line 50 is arranged in the display region 11, since the display region 11 has a large space, the display region 11 has enough space to arrange a certain number of compensation lines 50 having certain sizes. In this case, the actual compensation load can meet actual requirements and can reach the preset compensation value. Therefore, with the solution of arranging the compensation line 50 in the display region 11, the brightness difference between different regions in the display region 11 can be reduced, so as to uniform the display brightness of the entire display region 11 of the display panel 100.

Figure 14:
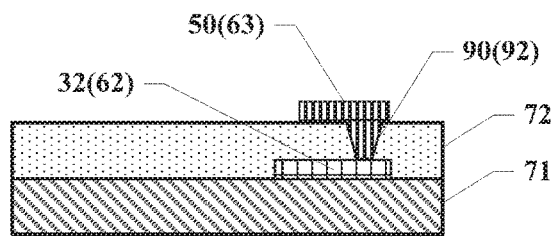
FIG. 14 is a schematic view of a film layer structure showing an electronic connection between a compensation line and a second data line at a first via hole in FIG. 13.

In an embodiment, reference is made to FIG. 14, which is a schematic view of a film layer structure showing an electronic connection between a compensation line and a second data line at a first via hole in FIG. 13. In this embodiment, at least one of compensation lines 50 is electronically connected with the second gate line 32 through a first via hole 90. The first via hole 90 may be a first B via hole 92 located on the second insulating layer 72.

Figure 15:
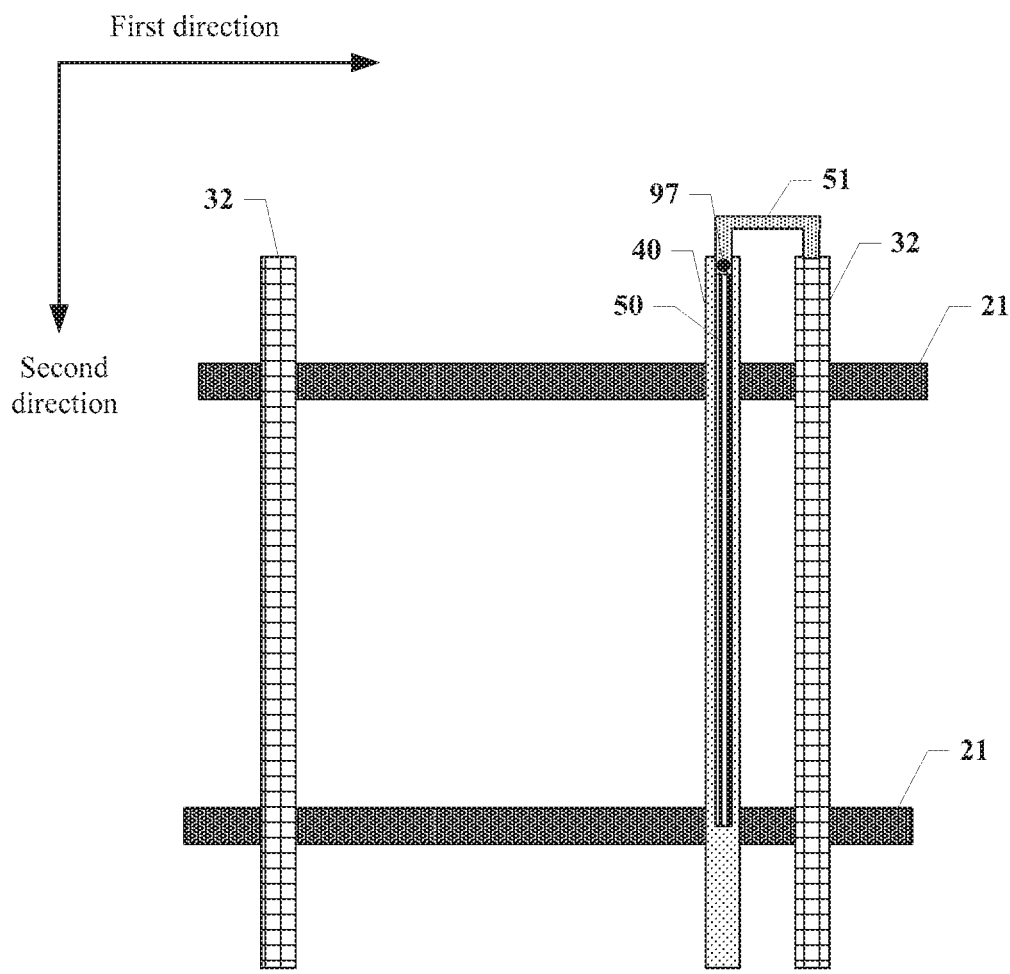
FIG. 15 is a schematic view showing a relative position between a second data line and a first connection lead according to an embodiment of the present disclosure.

In an embodiment, reference is made to FIG. 15, which is a schematic view showing a relative position between a second data line and a first connection lead according to an embodiment of the present disclosure. As shown in FIG. 15, at least one of compensation lines 50 is electronically connected with the second data line 32 through a first connection lead 51. The first connection lead 51 is located in the non-display region 12. Since the second data line 32 and the compensation line 50 are connected with each other through the first connection lead 51, the wiring on the display panel 100 is clear, and the logic thereof is clear.

Figure 16:
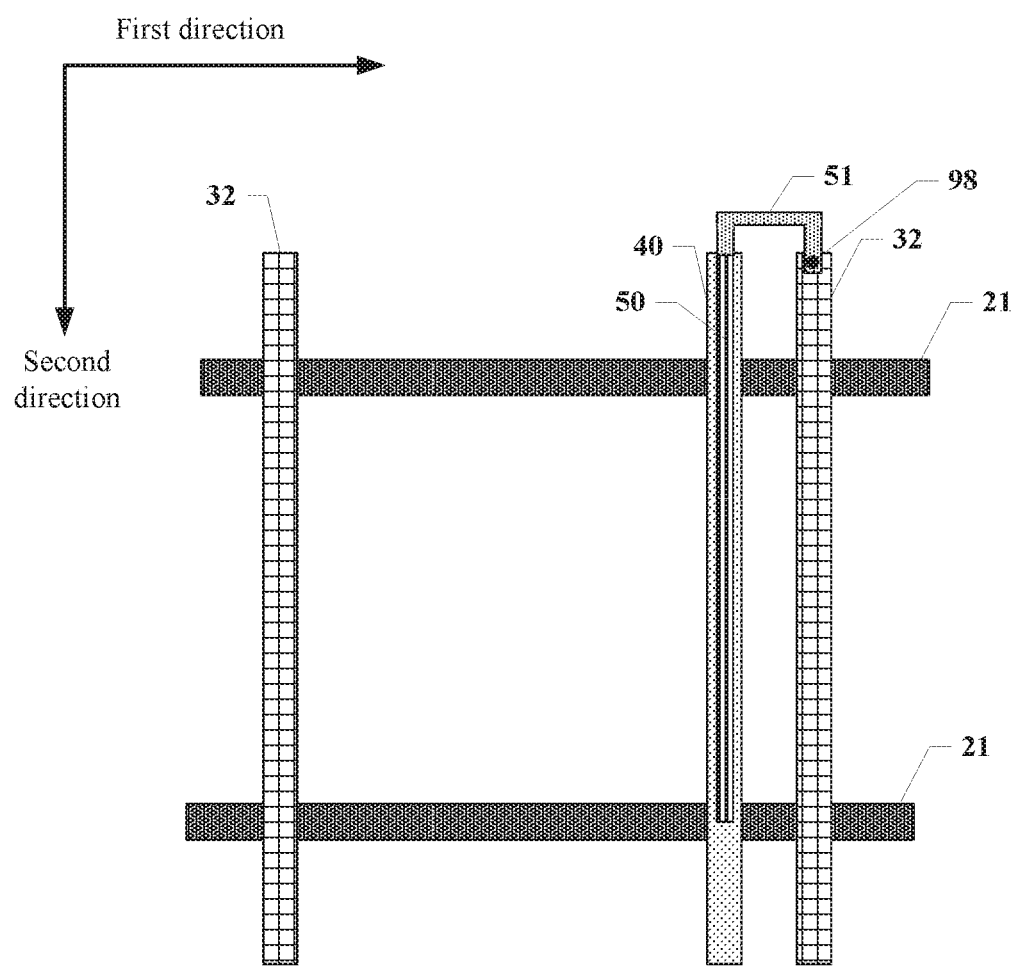
FIG. 16 is a schematic view showing another relative position between a second data line and a first connection lead according to an embodiment of the present disclosure.

In an embodiment, with reference to FIG. 15, the first connection lead 51 is arranged on the same layer as the second data line 32, and the first connection lead 51 is electronically connected with the compensation line 50 through a third A via hole 97 located on the second insulating layer 72. In another embodiment, with reference to FIG. 16, which is a schematic view showing another relative position between a second data line and a first connection lead according to an embodiment of the present disclosure, the first connection lead 51 is arranged on the same layer as the compensation line 50, and the first connection lead 51 is electronically connected with the second data line 32 through a third B via hole 98 located on the second insulating layer 72. Both the second data line 32 and the power supply line 40 are located on the second metal layer 62, the compensation line 50 is located on the third metal layer 63, and the second metal layer 62 and the third metal layer 63 are separated from each other by the second insulating layer 72. In this case, the via hole located on the second insulating layer 72 is required, so as to realize the electronic connection between circuits on the two above metal layers.

Figure 17:
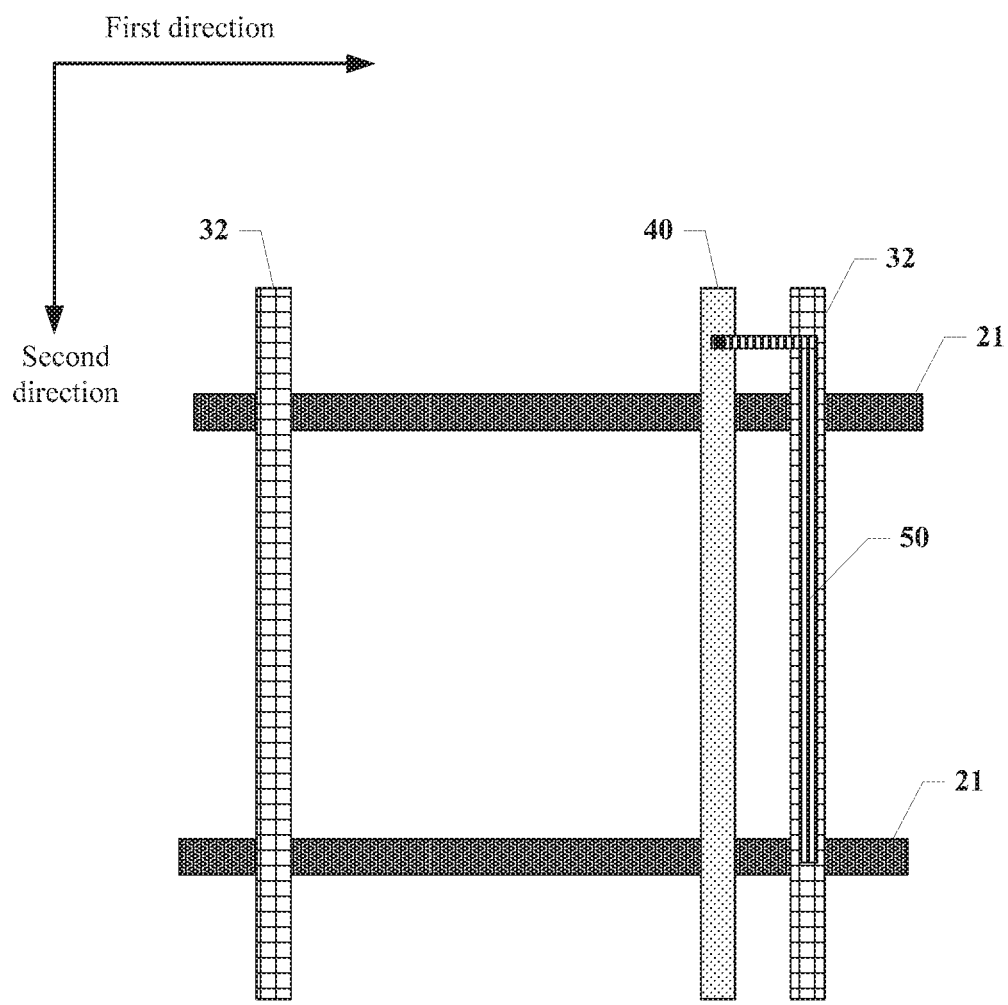
FIG. 17 is a schematic view showing another wiring of sub-pixel units corresponding to a second data line in FIG. 12.

FIG. 17 is a schematic view showing another wiring of sub-pixel units corresponding to a second data line in FIG. 12. The same contents of this embodiment as the above embodiment are not repeated herein. In this embodiment, the compensation line 50 is electronically connected with the power supply line 40, and a capacitance is formed between the compensation line 50 and the second data line 32. Since the introduced compensation line 50 have a resistance, the resistance compensation can be performed. In addition, since the capacitance is formed between the compensation line 50 and the second data line 32, the capacitance compensation can be performed. In this way, the load compensation can be performed on the pixel unit column corresponding to the second data line 32, so as to reduce the brightness difference between the regions in the display region 11, and uniform the brightness of the display region 11. The compensation line 50 is located in the display region 11 and does not occupy the non-display region 12, so that a narrow frame of the display panel 100 can be easily realized. Further, since the display region 11 has a large space, the actual compensation load can reach the preset compensation value, so as to uniform the brightness of the display panel 100.

In addition, in the above embodiment, the compensation is performed only on the second data line 32 under the Notch region 122 in FIG. 12. The data lines 30 in the second display region 112 may have different lengths, and the compensation may also be performed on a short data line 30 in the second display region 112 by using the above method, which is not repeated herein.

It should be noted that, in some other embodiments of the present disclosure, the to-be-compensated line may include both the second gate line 22 and the second data line 32. That is, the load compensation may be performed on both the second gate line 22 and the second data line 32. The compensation methods shown in FIG. 1, FIG. 4, and FIG. 12 may be used in combination, which is not limited in the present disclosure.

Figure 18:
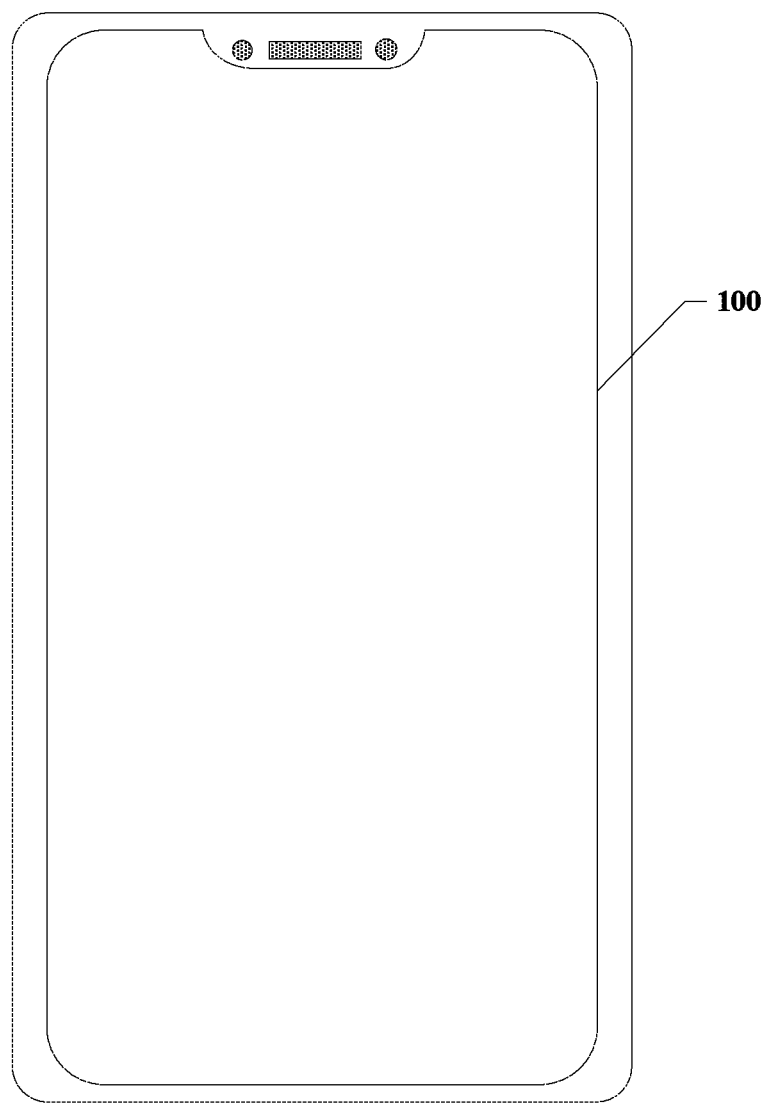
FIG. 18 is a schematic structural view of a display device according to an embodiment of the present disclosure.

Based on the same inventive concept, a display device 200 is further provided according to an embodiment of the embodiment. Reference is made to FIG. 18, which is a schematic structural view of a display device according to an embodiment of the present disclosure. The display device 200 includes the display panel 100 according to the embodiments of the present disclosure. The embodiment of the display device 200 may refer to the embodiments of the display panel 100, and the repeated description is omitted herein. It should be noted that the display device 200 according to the embodiment of the present disclosure may be any products or components having a display function, such as a mobile phone, a tablet computer, a television, a display, a notebook computer, a digital camera, and a navigation device.

It can be known from the above embodiments that, the present disclosure has the following beneficial effects.

According to the display panel and the display device provided in the present disclosure, with a compensation line, a short second gate line and/or a short second data line are compensated, to reduce a load difference between a second display region and a first display region due to different lengths of gate lines or data lines, so as to uniform display brightness of the first display region and the second display region and enhance user visual experience. In the present disclosure, the compensation line is arranged in the display region, greatly saving the space of the non-display region, and facilitating realization of a narrow frame of the display panel and the display device, as compared with a solution of arranging the compensation line in the non-display region. In addition, if the compensation line is arranged in the non-display region, a compensation load is often difficult to reach a preset compensation value due to the limited space of the non-display region. In the present disclosure, the compensation line is arranged in the display region. Since the display region has a large space, the display region has enough space to arrange a certain number of compensation lines having certain sizes. In this case, an actual compensation load can meet actual requirements, so as to uniform display brightness of different display regions of the display panel.

The invention claimed is:

1. A display panel, comprising:
a substrate;
a display region, and a non-display region surrounding the display region, wherein the display region is divided into a first display region and at least one second display region smaller than the first display region;
a first metal layer, a first insulating layer, a second metal layer, a second insulating layer, and a third metal layer which are sequentially arranged in a direction away from the substrate;
a plurality of gate lines extending in a first direction and arranged in a second direction, a plurality of data lines arranged in the first direction and extending in the second direction, and a plurality of power supply lines arranged in the first direction and extending in the second direction, which are arranged above the substrate, wherein the first direction intersects the second direction, the plurality of gate lines is located on the first metal layer, the plurality of data lines and the plurality of power supply lines are located on the second metal layer, the plurality of gate lines comprises first gate lines and second gate lines shorter than the first gate lines, the plurality of data lines comprises first data lines and second data lines shorter than the first data lines, the first gate lines are located in the first display region, the second gate lines are located in the second display region; and
a plurality of compensation lines and to-be-compensated lines located in the display region, wherein each of the to-be-compensated lines is one of the second gate lines or one of the second data lines, and the plurality of compensation lines is located on the third metal layer, wherein
each of the plurality of compensation lines is electronically connected with one of the to-be-compensated lines, an orthographic projection of the compensation line on the substrate is overlapped with an orthographic projection of one of the plurality of power supply lines on the substrate, and a capacitance is formed between the compensation line and the power supply line; or
each of the plurality of compensation lines is electronically connected with one of the plurality of power supply lines, an orthographic projection of the compensation line on the substrate is overlapped with an orthographic projection of one of the to-be-compensated lines on the substrate, and a capacitance is formed between the compensation line and the to-be-compensated line.

2. The display panel according to claim 1, wherein in the case that a capacitance is formed between the compensation line and the power supply line, an extension direction of the compensation line is the same as an extension direction of the power supply line.

3. The display panel according to claim 2, wherein each of the to-be-compensated lines is electronically connected with one or more compensation lines among the plurality of compensation lines.

4. The display panel according to claim 3, wherein at least one of the compensation lines is electronically connected with the to-be-compensated line through a first via hole.

5. The display panel according to claim 4, wherein the first via hole is a first A via hole located on the first insulating layer and the second insulating layer, or a first B via hole located on the second insulating layer; wherein
in a case that the to-be-compensated line is the second gate line, the compensation line is electronically connected with the second gate line via the first A via hole;
in a case that the to-be-compensated line is the second data line, the compensation line is electronically connected with the second gate line via the first B via hole.

6. The display panel according to claim 3, wherein at least one of the compensation lines is electronically connected with the to-be-compensated line through a first connection lead, and the first connection lead is located in the non-display region.

7. The display panel according to claim 6, wherein in a case that the to-be-compensated line is the second gate line,
the first connection lead and the second gate line are arranged on a same layer, and the first connection lead is electronically connected with the compensation line through a second A via hole located on the first insulating layer and the second insulating layer; or
the first connection lead and the compensation line are arranged on a same layer, and the first connection lead is electronically connected with the second gate line through a second B via hole located on the first insulating layer and the second insulating layer,
wherein in a case that the to-be-compensated line is the second data line,
the first connection lead and the second data line are arranged on a same layer, and the first connection lead is electronically connected with the compensation line through a third A via hole located on the second insulating layer; or
the first connection lead and the compensation line are arranged on a same layer, and the first connection lead is electronically connected with the second data line through a third B via hole located on the second insulating layer.

8. The display panel according to claim 1, wherein in the case that a capacitance is formed between the compensation line and the to-be-compensated line, an extension direction of the compensation line is the same as an extension direction of the to-be-compensated line.

9. The display panel according to claim 8, wherein in the display region, an orthographic projection of each of the to-be-compensated lines on the substrate is overlapped with an orthographic projection of one of the plurality of compensation lines on the substrate.

10. The display panel according to claim 8, wherein in the display region, an orthographic projection of each of the to-be-compensated lines on the substrate is overlapped with orthographic projections of segmented compensation lines among the plurality of compensation lines on the substrate.

11. The display panel according to claim 1, wherein the display region is provided with a plurality of pixel unit rows arranged in the second direction, each of the plurality of pixel unit rows comprises a plurality of sub-pixel units each defined by adjacent data lines among the plurality of data lines and adjacent gate lines among the plurality of gate lines, wherein
in the second display region, the number of sub-pixel units in a pixel unit row close to the first display region among the plurality of pixel unit rows is greater than the number of sub-pixel units in a pixel unit row away from the first display region among the plurality of pixel unit rows.

12. The display panel according to claim 11, wherein in a case that the to-be-compensated line is the second gate line,
an overlapping area between orthographic projections of the compensation line and the power supply line corresponding to the pixel unit row close to the first display region on the substrate is less than an overlapping area between orthographic projections of the compensation line and the power supply line corresponding to the pixel unit row away from the first display region on the substrate; or
an overlapping area between orthographic projections of the compensation line and the second gate line corresponding to the pixel unit row close to the first display region on the substrate is less than an overlapping area between orthographic projections of the compensation line and the second gate line corresponding to the pixel unit row away from the first display region on the substrate.

13. The display panel according to claim 12, wherein a width of the compensation line corresponding to the pixel unit row close to the first display region is less than a width of the compensation line corresponding to the pixel unit row away from the first display region.

14. The display panel according to claim 1, further comprising:
a thin film transistor array layer arranged above the substrate in a direction away from the substrate, wherein the thin film transistor array layer comprises a gate metal layer and a source drain metal layer, the gate metal layer is located on the first metal layer, and the source drain metal layer is located on the second metal layer.

15. A display device, comprising:
a display panel, comprising:
a substrate;
a display region, and a non-display region surrounding the display region, wherein the display region is divided into a first display region and at least one second display region smaller than the first display region;
a first metal layer, a first insulating layer, a second metal layer, a second insulating layer, and a third metal layer which are sequentially arranged in a direction away from the substrate;
a plurality of gate lines extending in a first direction and arranged in a second direction, a plurality of data lines arranged in the first direction and extending in the second direction, and a plurality of power supply lines arranged in the first direction and extending in the second direction, which are arranged above the substrate, wherein the first direction intersects the second direction, the plurality of gate lines is located on the first metal layer, the plurality of data lines and the plurality of power supply lines are located on the second metal layer, the plurality of gate lines comprises first gate lines and second gate lines shorter than the first gate lines, the plurality of data lines comprises first data lines and second data lines shorter than the first data lines, the first gate lines are located in the first display region, the second gate lines are located in the second display region; and a plurality of compensation lines and to-be-compensated lines located in the display region, wherein each of the to-be-compensated lines is one of the second gate lines or one of the second data lines, and the plurality of compensation lines is located on the third metal layer, wherein each of the plurality of compensation lines is electronically connected with one of the to-be-compensated lines, an orthographic projection of the compensation line on the substrate is overlapped with an orthographic projection of one of the plurality of power supply lines on the substrate, and a capacitance is formed between the compensation line and the power supply line; or each of the plurality of compensation lines is electronically connected with one of the plurality of power supply lines, an orthographic projection of the compensation line on the substrate is overlapped with an orthographic projection of one of the to-be-compensated lines on the substrate, and a capacitance is formed between the compensation line and the to-be-compensated line.

16. The display device according to claim 15, wherein in the case that a capacitance is formed between the compensation line and the power supply line, an extension direction of the compensation line is the same as an extension direction of the power supply line.

17. The display device according to claim 15, wherein in the case that a capacitance is formed between the compensation line and the to-be-compensated line, an extension direction of the compensation line is the same as an extension direction of the to-be-compensated line.

* * * * *